(12) United States Patent
Gustafson et al.

(10) Patent No.: US 6,888,983 B2
(45) Date of Patent: May 3, 2005

(54) DYNAMIC GAIN AND CHANNEL EQUALIZERS

(75) Inventors: Eric K. Gustafson, Palo Alto, CA (US); Asif A. Godil, Mountain View, CA (US)

(73) Assignee: LightConnect, Inc., Newark, CA (US)

(*) Notice: Subject to any disclaimer, the term of this patent is extended or adjusted under 35 U.S.C. 154(b) by 575 days.

(21) Appl. No.: 09/900,753

(22) Filed: Jul. 6, 2001

(65) Prior Publication Data

US 2002/0061166 A1 May 23, 2002

Related U.S. Application Data

(63) Continuation-in-part of application No. 09/549,781, filed on Apr. 14, 2000.

(51) Int. Cl.[7] .................................................. G02B 6/32
(52) U.S. Cl. ............................. 385/33; 385/37; 385/34; 385/10
(58) Field of Search ............................. 385/33, 10, 15, 385/16, 18, 27, 31, 34, 37

(56) References Cited

U.S. PATENT DOCUMENTS

| | | | |
|---|---|---|---|
| 5,629,801 A | 5/1997 | Staker et al. | |
| 5,661,592 A | 8/1997 | Bornstein et al. | |
| 5,731,802 A | 3/1998 | Aras | |
| 5,764,280 A | 6/1998 | Bloom et al. | |
| 5,798,743 A | 8/1998 | Bloom | |
| 5,808,797 A | 9/1998 | Bloom et al. | |
| 5,841,579 A | 11/1998 | Bloom et al. | |
| 5,982,553 A | 11/1999 | Bloom et al. | |
| 5,986,634 A | 11/1999 | Aloishin et al. | |
| 5,995,281 A | * 11/1999 | Simon et al. | 359/368 |
| 6,004,912 A | 12/1999 | Gudeman | |
| 6,064,404 A | 5/2000 | Aras et al. | |
| 6,069,576 A | 5/2000 | Gwin | |
| 6,088,102 A | 7/2000 | Manhart | |
| 6,101,036 A | 8/2000 | Bloom | |
| 6,130,770 A | 10/2000 | Bloom | |
| 6,178,284 B1 | 1/2001 | Bergmann et al. | |
| 6,215,579 B1 | 4/2001 | Bloom et al. | |
| 6,251,842 B1 | 6/2001 | Gudeman | |
| 6,271,808 B1 | 8/2001 | Corbin | |
| 6,285,500 B1 | * 9/2001 | Ranalli et al. | 359/497 |
| 6,301,048 B1 | * 10/2001 | Cao | 359/566 |
| 6,453,095 B2 | * 9/2002 | Feng et al. | 385/37 |

* cited by examiner

*Primary Examiner*—Frank G. Font
*Assistant Examiner*—K. Cyrus Kianni
(74) *Attorney, Agent, or Firm*—James E. Eakin

(57) ABSTRACT

A beam refraction apparatus includes an input fiber carrying an input beam. A wavelength dispersive element is coupled to the input fiber. The wavelength dispersive element spreads the input beam in at least one dimension as a function of wavelength and generates a dispersed beam. A controllable grating reflects the dispersed beam to the wavelength dispersive element and generates a recombined beam. The controllable grating provides a controllable reflectivity as a function of wavelength. An output fiber receives the recombined beam. A collimating optical member is coupled to the input and output fibers. The collimating optical member passes the input beam and the recombined beams in parallel and opposite directions.

18 Claims, 9 Drawing Sheets

Two Fiber Dynamic Gain Equalizer

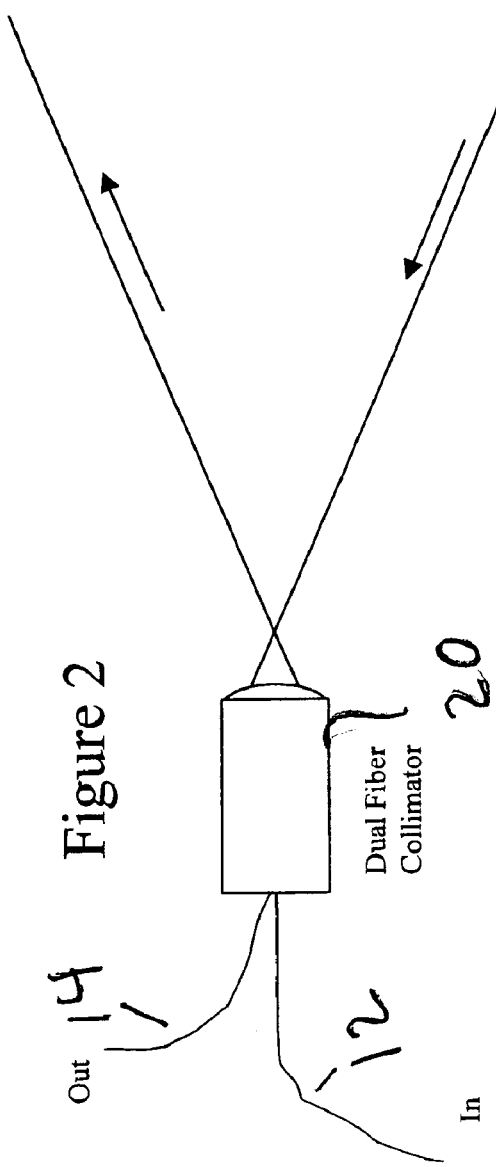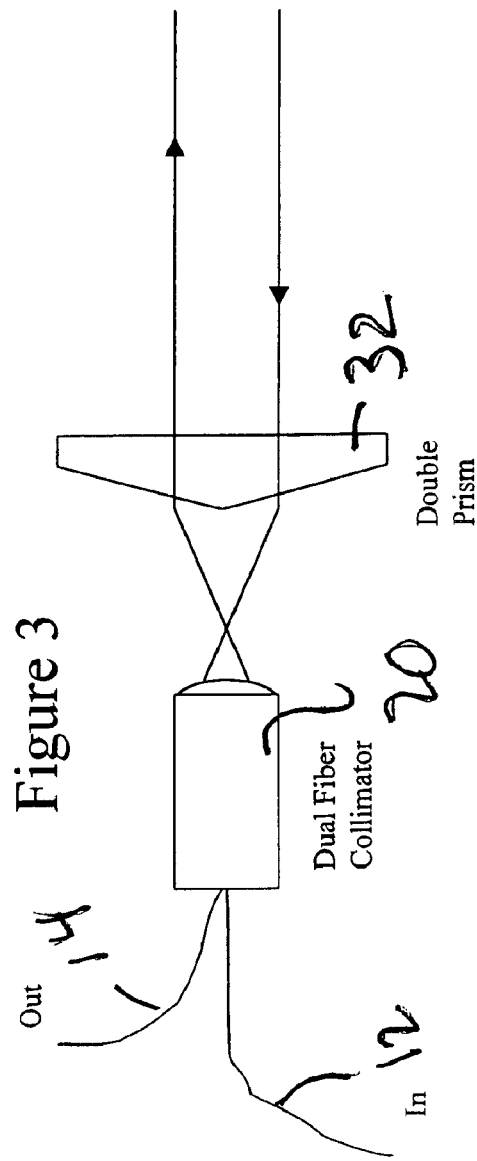

Optical Spectrum Analyzer

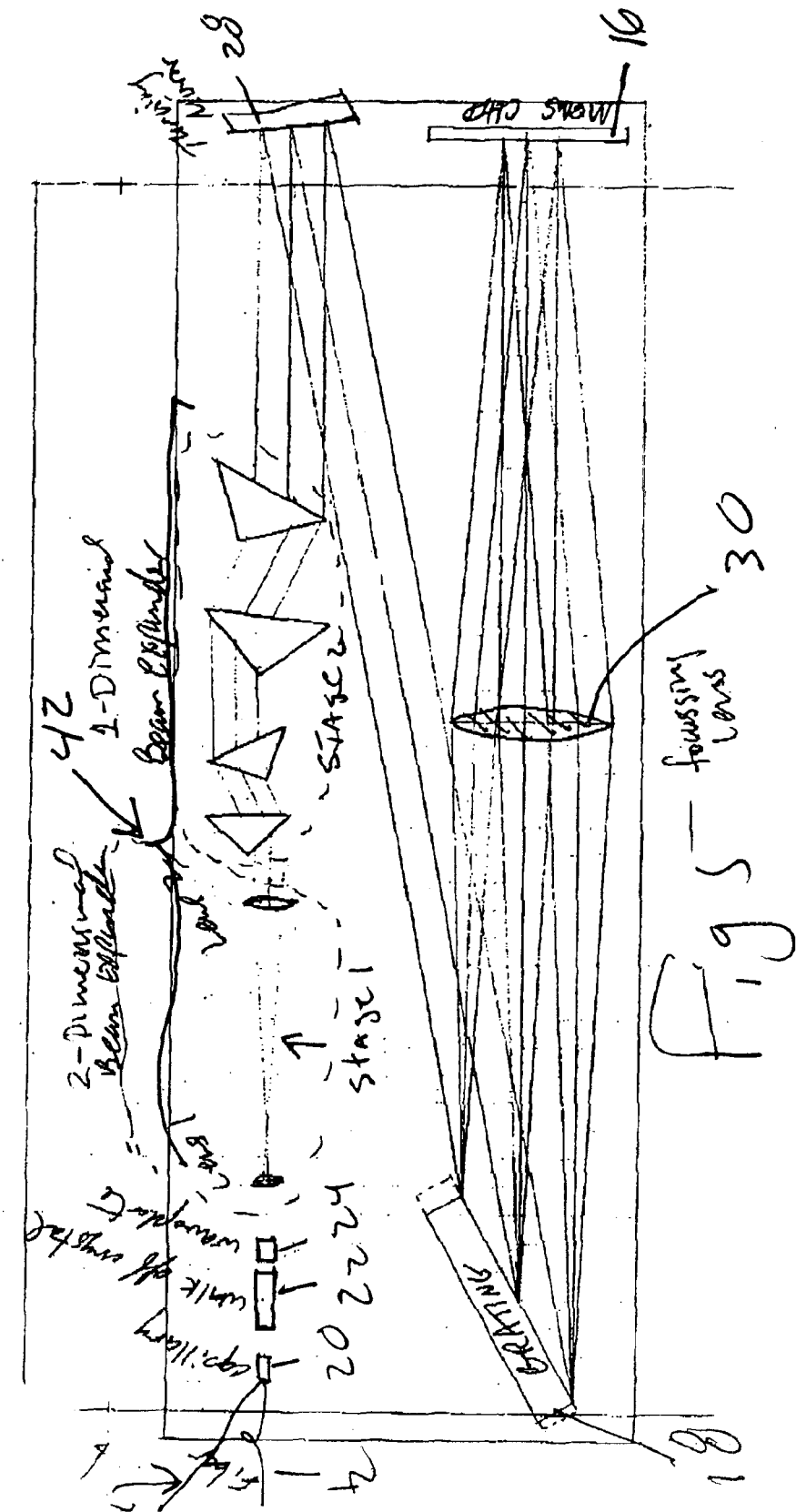

Snells Law

Wavelength Dispersion

Beam Magnification

Wavelength Dispersion

Magnification

Magnification

Dispersion

Low PDL Channel by Channel Attenuator

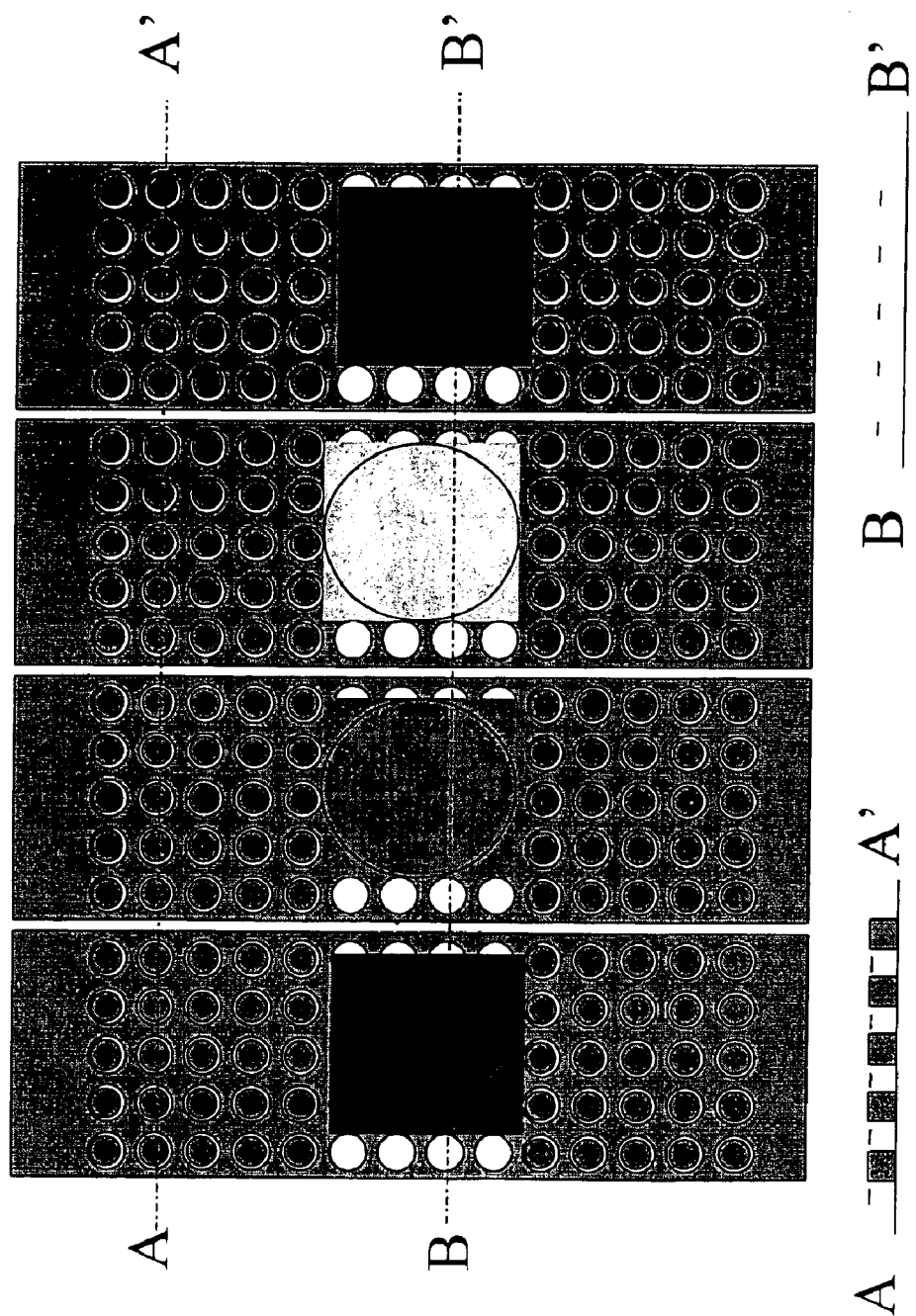

DYNAMIC GAIN AND CHANNEL EQUALIZERS

CROSS REFERENCE TO RELATED APPLICATIONS

This application is a continuation-in-part of and claims the benefit of priority from the U.S. application Ser. No. 09/549,781, filed Apr. 14, 2000, which application is fully incorporated herein by reference.

BACKGROUND OF THE INVENTION

1. Field of the Invention

The present invention relates generally to beam refraction systems, and more particularly to dynamic gain equalizers, spectrum analyzers and dynamic channel equalizers that are used in a dynamic compensation system that provides feedback across the entire spectrum.

2. Description of Related Art

Wavelength division multiplexing (WDM) provides a technique for increasing a transmission capacity by a single optical fiber. In a system adopting WDM, a plurality of optical carriers with different wavelengths are used. The plural optical carriers are individually modulated to obtain a plurality of optical signals. These are wavelength division multiplexed by an optical multiplexer to obtain WDM signal light which is output to an optical fiber transmission line. On the receiving side, the WDM signal light received is separated into individual optical signals by an optical demultiplexer, and transmitted data is reproduced according to each optical signal. Accordingly, by applying WDM, the transmission capacity in a single optical fiber can be increased according to the number of WDM channels.

In the case of incorporating an optical amplifier into a system adopting WDM, a transmission distance is limited by the wavelength characteristic of gain which is represented by a gain tilt or gain deviation. For example, in an EDFA, it is known that a gain tilt is produced at wavelengths in the vicinity of 1.55 mu m, and this gain tilt varies with total input power of signal light and pump light power to the EDFA.

A gain equalization method is known that measures against the wavelength characteristic of gain of an optical amplifier. A plurality of optical signals with different wavelengths are output from optical senders and are multiplexed in an optical multiplexer to obtain WDM signal light. The WDM signal light is then output to an optical transmission line which is configured by inserting a plurality of optical amplifiers, that compensate for losses, and at least one gain equalizer in an optical fiber transmission line. The WDM signal light transmitted by the optical-transmission line is separated into individual optical signals according to wavelengths by an optical demultiplexer. These optical signals are then supplied to optical receivers If each optical amplifier has a wavelength characteristic of gain in the band of the WDM signal light, a gain tilt or gain deviation is accumulated over the length of the optical transmission line. This causes an interchannel deviation in signal power or signal-to-noise ratio. In the gain equalization method, the wavelength characteristic of loss of each gain equalizer is set in order to cancel the wavelength characteristic of total gain of the cascaded optical amplifiers. The wavelength characteristic of total gain is canceled by the wavelength characteristic of total loss in the band of the WDM signal light. In this manner gain equalization is achieved in the entire transmission line.

When an EDFA is used as each optical amplifier, the wavelength characteristic of gain of the EDFA is asymmetrical with respect to a wavelength axis in general. In contrast, the wavelength characteristic of loss of one optical filter usable as an element of each gain equalizer is symmetrical with respect to a wavelength axis in general. Accordingly, in the case that each gain equalizer includes only one optical filter, the asymmetrical wavelength characteristic of total gain of the cascaded optical amplifiers cannot be compensated. As the optical filter, a dielectric multilayer filter, etalon filter, Mach-Zehnder filter, etc. are known.

Gain equalizer is also achieved by combining two or more optical filters with different wavelength characteristics of loss. With this configuration, the wavelength characteristic of gain can be canceled by the wavelength characteristic of loss with high accuracy in a given band of WDM signal light.

Additional information on gain equalization methods is described in N. S. Bergano et al., "Wavelength division multiplexing in long-haul transmission systems", JOURNAL OF LIGHTWAVE TECHNOLOGY, VOL. 14, NO. 6, JUNE 1996, pp 1229–1308. (2) K. Oda et al., "128-channel, 480-km FSK-DD transmission experiment using 0.98 mu m pumped erbium doped fibre amplifiers and a tunable gain equaliser", ELECTRONICS LETTERS, 9 Jun. 1994, Vol. 30, No. 12, pp 982–983. (3) T. Naito et al., "85-Gb/s WDM transmission experiment over 7931-km using gain equalization to compensate for asymmetry in EDFA gain characteristics", First Optoelectronics and Communications Conference (OECC '96) Technical Digest, July 1996, PD1–2. (4) T. Oguma et al., "Optical gain equalizer for optical fiber amplifier", Communications Society Conference, IEICE, 1996, B-1093 (pp 578).

The wavelength characteristic of gain of an optical amplifier changes according to operating conditions such as a pumped condition of the optical amplifier and an input power of signal light. In a submarine optical repeater system the input power to an optical amplifier may change because of an increase in optical fiber loss due to aging or because of cable patching for repairing. Such a change in system condition causes a change in operating conditions of the optical amplifier, resulting in a change in its wavelength characteristic of gain. Further, there is a possibility that the wavelength characteristic of gain may deviate from a design value because of variations in quality of optical amplifiers manufactured.

In the conventional gain equalization method using an optical filter with a fixed wavelength characteristic of loss, problems occur when the wavelength characteristic of gain of an optical amplifier changes because of changes in system conditions. In this instance, the new wavelength characteristic of gain of the optical amplifier does not coincide with the wavelength characteristic of loss of the optical filter. This produces an equalization error. The equalization error varies according to the system condition, and a large amount of variations in the equalization error may cause an interchannel deviation in signal power or optical SNR or may remarkably deteriorate a transmission quality in a certain channel. However, the conventional variable gain equalizer cannot obtain an arbitrary wavelength characteristic of loss in response to variations in equalization error, so that variations in equalization error due to changes in system condition cannot be sufficiently suppressed.

There is a need for a dynamic compensation system that provides feedback acros the entire spectrum.

SUMMARY OF THE INVENTION

Accordingly, an object of the present invention is to provide a dynamic compensation system that provides feedback across the entire spectrum.

Another object of the present invention is to provide an improved dual fiber dynamic gain equalizer.

Yet another object of the present invention is to provide a dual fiber dynamic gain equalizer and a spectrum analyzer.

A further object of the present invention is to provide an improved dynamic channel equalizer.

These and other objects of the present invention are achieved in a beam refraction apparatus that includes an input fiber carrying an input beam. A wavelength dispersive element is coupled to the input fiber. The wavelength dispersive element spreads the input beam in at least one dimension as a function of wavelength and generates a dispersed beam. A controllable grating reflects the dispersed beam to the wavelength dispersive element and generates a recombined beam. The controllable grating provides a controllable reflectivity as a function of wavelength. An output fiber receives the recombined beam. A collimating optical member is coupled to the input and output fibers. The collimating optical member passes the input beam and the recombined beams in parallel and opposite directions.

In another embodiment of the present invention, a beam refraction apparatus includes an input fiber that carries an input beam. A wavelength dispersive element is coupled to the input fiber. The wavelength dispersive element spreads the input beam in at least one dimension as a function of wavelength and generates a dispersed beam. A controllable grating reflects the dispersed beam to the wavelength dispersive element and generates a recombined beam. The controllable grating provides a controllable reflectivity as a function of wavelength. An output fiber receives a first portion of the recombined beam from the controllable grating. A detector array is positioned to receive a second portion of the recombined beam from the controllable grating.

In another embodiment of the present invention, a dynamic channel equalizer includes an input fiber that carries an input beam. A wavelength dispersive element is coupled to the input fiber. The wavelength dispersive element spreads the input beam in at least one dimension as a function of wavelength and generates a dispersed beam. A controllable grating reflects the dispersed beam to the wavelength dispersive element and generates a recombined beam. The controllable grating provides a controllable reflectivity as a function of wavelength. An output fiber receives a first portion of the recombined beam from the controllable grating. A prism expander is coupled to the input fiber. The prism expander making the input beam larger in one direction and compressing the output beam.

BRIEF DESCRIPTION OF THE DRAWINGS

FIG. 2 illustrates one embodiment of a dual fiber collimator useful with the FIG. 1 two fiber dynamic gain equalizer, illustrating the input and output modes separated by approximately 3.6 degrees.

FIG. 3 illustrates an embodiment of a double prism useful with the FIG. 1 two fiber dynamic gain equalizer, that has two modes parallel with a separation of 1 mm.

FIG. 5 illustrates one embodiment of a dynamic channel equalizer of the present invention.

FIG. 9(b) illustrates an embodiment of a low PDL channel by channel attenuator with islands.

DETAILED DESCRIPTION OF THE INVENTION

Figure 1:
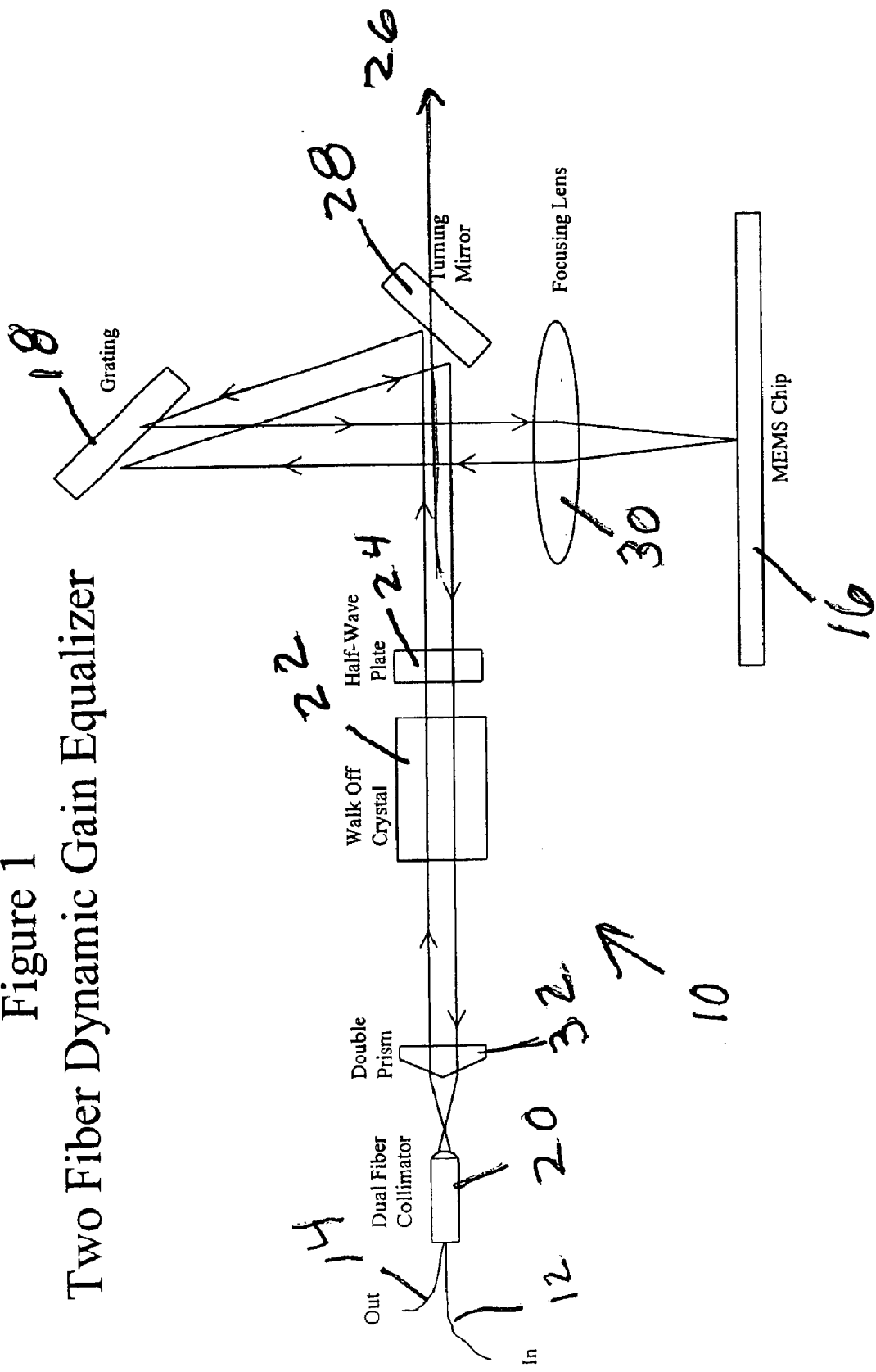
FIG. 1 illustrates a two fiber dynamic gain equalizer embodiment of the present invention.

Referring to FIG. 1, one embodiment of a dual fiber dynamic gain equalizer (DGE) 10 of the present invention includes an input fiber 12 carrying an input beam. In this embodiment, the signal enters through input fiber and exists through an output fiber 14. A wavelength dispersive element 16 spreads the input beam in at least one dimension as a function of wavelength and generates a dispersed beam. A controllable grating 18 reflects the dispersed beam to wavelength dispersive element 16 and generates a recombined beam. Controllable grating 18 provides a controllable reflectivity as a function of wavelength. Output fiber 14 receives the recombined beam. A collimating optical member 20 is coupled to input and output fibers 12 and 14. Collimating optical member 20 passes the input beam and the recombined beams in parallel and opposite directions. DCE 10 is an actuator that can modify the spectral shape of a wavelength region by chaning power through attenuation.

Collimating optical member 20 can be a number of devices including but not limited to a dual fiber collimator, prism, pair of mirrors, one or more cylindrical lenses, and the like. A walk-off crystal 22 can be included and positioned adjacent to collimating optical member 20. A halfwave plate 24 is optionally positioned adjacent to walk-off crystal 22.

A reflector 26 can be included and positioned along an optical path 28 of collimating optical member 20. Reflector 26 directs at least a portion of the input beam to controllable grating 18. In one embodiment, reflector 26 is a turning mirror.

Preferably, wavelength dispersive element 16 includes at least one or more microelectromechanical devices. Suitable microelectromechanical devices can be a MEMS chip, such as those disclosed in U.S. application Ser. No. 09/549,781, including but are not limited to one or more, micro mirrors, cantilevers, light controlling devices, deformable grating modulators, and the like.

Controllable grating 18 can be an array with a diffraction efficiency that is controlled as a function of position on the array. Controllable 18 can also be an array of ribbons, a micromachined grating device, and the like. Optionally, a focusing lens 30 is positioned between wavelength dispersive element 16 and controllable grating 18.

DGE 10 eliminates the need for a circulator. FIG. 2 illustrates that the input and output modes of collimating optical member 20 can be separated by approximately 3.6 degrees. However, the modes in DGE 10 must travel parallel if they are to impinge on controllable grating 18 at the same incidence angle. A double prism 32, illustrated in FIG. 3, makes these two modes parallel with a separation on the order of 1 mm. The forward traveling beam then passes through walk off crystal 22 and is separated into two linearly polarized beams, one vertically polarized and one horizontally polarized. These two beams are typically separated by about 1 mm. The vertically polarized beam is then passed through half wave plate 24 to make it horizontally polarized. These two horizontally polarized beams are then reflected from turning mirror 28 and directed to controllable grating 18.

In the embodiment of a single wavelength, the beams pass through focusing lens 30 which has a focal length "f". Focusing lens 30 is positioned a distance L=f from wavelength dispersive element 16. Thus the beam entering focusing lens 30 at a first position is steered by focusing lens 30 to a point on wavelength dispersive element 16 that allows the beam to pass through focusing lens 30 at a second position where it is steered to be anti-parallel to the incident beam. This beam traces out a path through DGE 10 and is redirected at double prism 32 to collimating optical member 20, and coupled into output fiber 14 with high efficiency. In a similar manner, the horizontally and vertically polarized beams pass along parallel paths and arrive at output fiber 14 after being recombined by walk off crystal 22.

Figure 4:
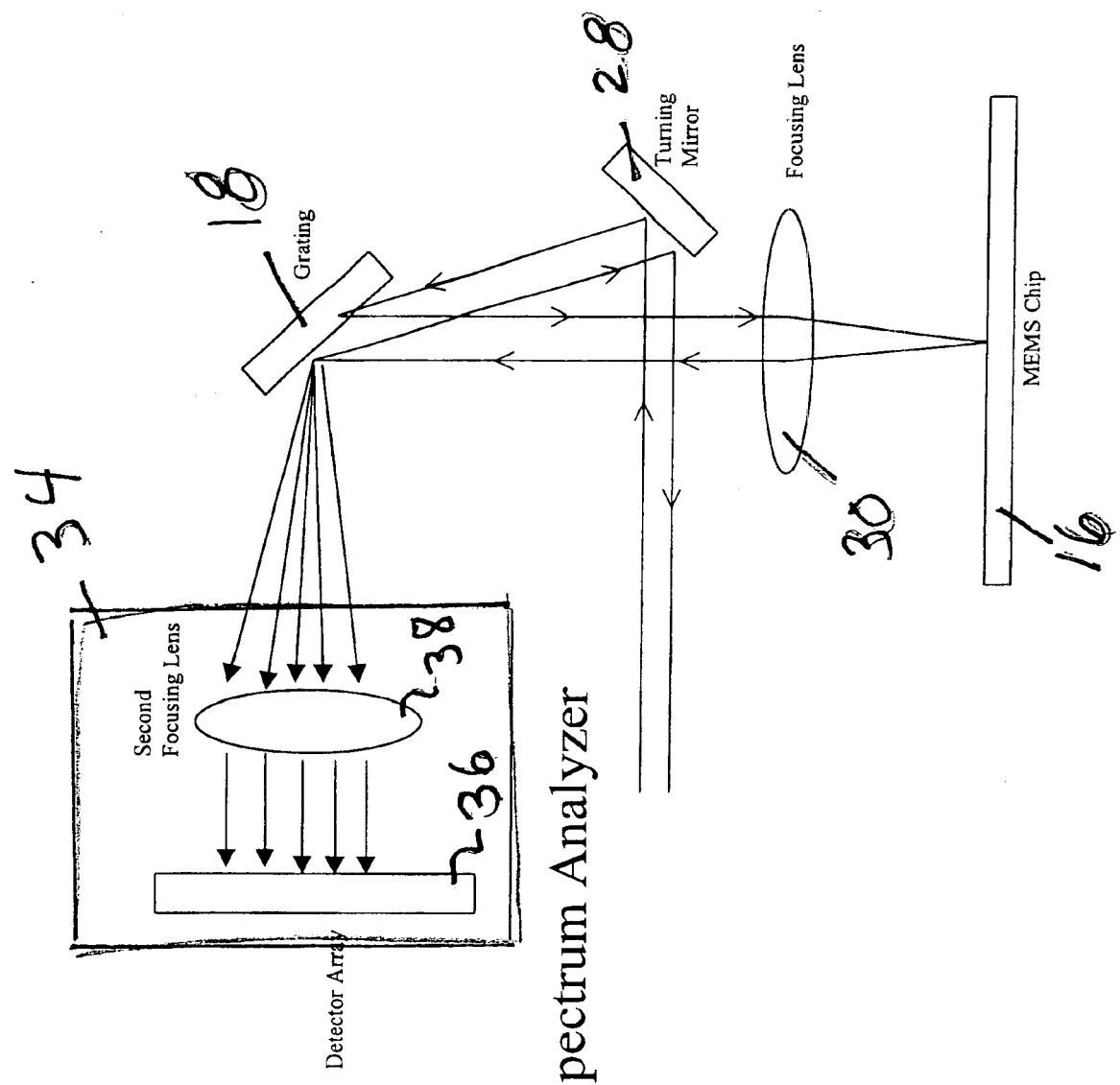
FIG. 4 illustrates an embodiment of an optical spectrum analyzer of the present invention.

Double prism 32 can be rotated about its apex to produce parallel beams from those beams that are not separated by exactly 3.6 degrees. Thus double prism 32, used at different incidence angles, can compensate for dual fiber collimators that have a range of spreading angles In one embodiment, DGE 10 is an actuator that can modify the state of an optical network over a range of wavelengths. To realize the full benefits of DGE 10 as a precisely controllable component in an optical network, a sensor, generally denoted as spectrum analyer 34, is coupled with DGE 10 in order to provide information about the state of the network over a range of wavelengths. Optionally, spectrum analyzer 34 can be external or internal to DGE 10. As illustrated in FIG. 4, spectrum analyzer 34 is an optical spectrum analyzer that measures the optical power in a narrow wavelength band as a function of the center wavelength of that narrow band. Spectrum analyzer 34 can include a detector array 36.

Light is reflected from wavelength dispersive element 16, passes through focusing lens 30, is recombined on controllable grating 18, and then passes back through DGE 10. However, at the point where the angularly dispersed light is recombined on controllable grating 18, a small fraction of this light is also reflected from controllable grating 18. This reflected light, which has the wavelengths that are angularly dispersed, is passed through a second focusing lens 38 and then impinges on detector array 36. Each detector in detector array 36 provides power information over a narrow wavelength band that is centered at a particular wavelength. This provide feedback information to DGE 10.

Another embodiment of the present invention, illustrated in FIG. 5, is a dynamic channel equalizer (DCE) 40 that includes input fiber 12, output fiber 14, wavelength dispersive element 16, controllable grating 18 and a prism expander 42. Wavelength dispersive element 16 spreads the input beam in at least one dimension as a function of wavelength and generates a dispersed beam. Controllable grating 18 reflects the dispersed beam to wavelength dispersive element 16 and generates a recombined beam. Controllable grating 18 provides a controllable reflectivity as a function of wavelength. Output fiber 14 receives a first portion of the recombined beam from controllable grating 18. Prism expander 42 is coupled to input fiber 12. Prism expander 42 makes the input beam larger in one direction and compresses the output beam. Suitable prism expanders 42 include but are not limited to multiple prisms, cylindrical lenses, cylindrical mirrors, symmetrical lenses, and the like. In one embodiment, prism expander 42 has a first set of optical elements, such as symmetrical lenses which blow the beam up in both the X and Y directions. In this embodiment, prism expander 42 has a second stage which then expands the beam only in the Y direction.

DCE 40 can be an attenuator for each channel without effecting adjacent channels. DCE 40 is similar to DGE 10 except has a wavelength resolution sufficient to make it possible to select individual channels and attenuate them without affecting the two adjacent channels. In one embodiment of DCE 40, the channels are spaced by 50 GHz which corresponds, at 1550 nm, to a wavelength spacing of 0.4 nm. Prism expander 42 increases the spot size on controllable grating 18. This spot expansion only needs to occur in the axis perpendicular to controllable grating 18 lines and can remain unchanged in the other direction. To increase the resolution by a factor of 10 the spot is preferably increased in size by a factor of 10.

Figure 6A:
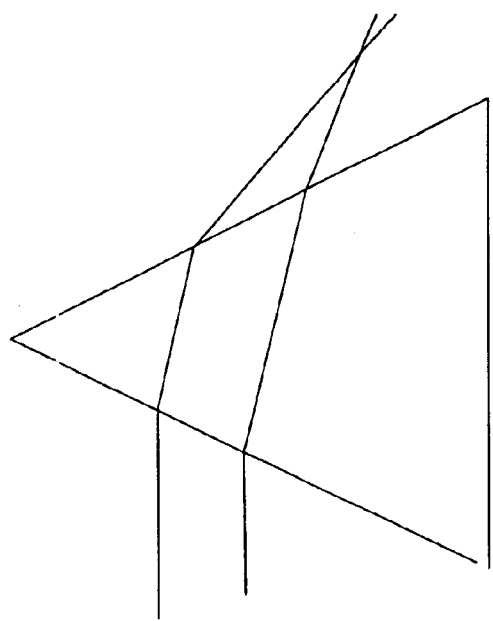
FIG. 6(a) illustrates the passage of light beam through a prism result in an angular deflection of a beam.
Figure 6B:
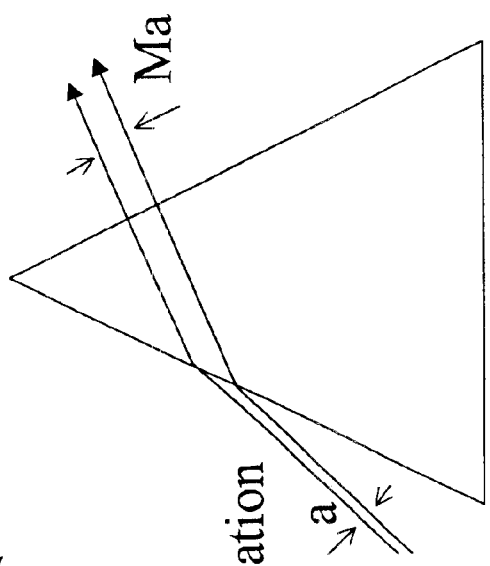
FIG. 6(b) illustrates the dispersion of the refractive index of the FIG. 6(a) prism.
Figure 6C:
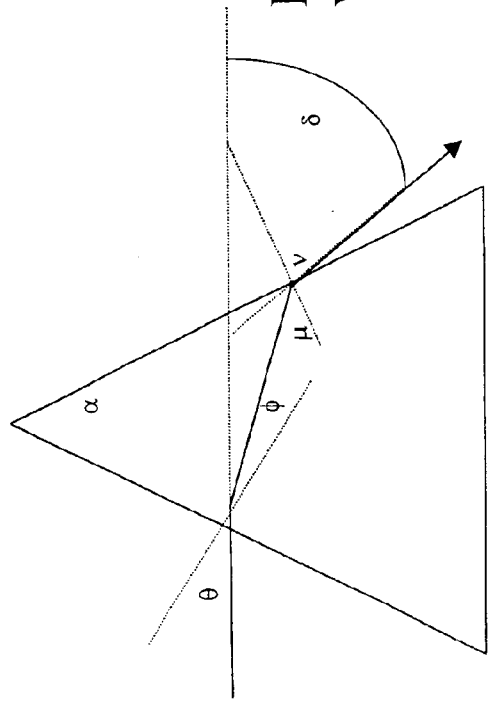
FIG. 6(c) illustrates an embodiment of a beam expanding in the direction of the FIG. 6(a) prism.

FIG. 6($a$) illustrates that passage of a light beam through a prism results in the angular deflection of the beam. The incident and diffracted angles satisfy Snells law $$\sin(\theta) = n(\lambda)\sin(\phi) \quad \sin(v) = n(\lambda)\sin(\mu)$$

For a prism with an apex angle of the overall deflection of the beam satisfies $$\delta = |\theta - \alpha + v|$$

As illustrated in FIG. 6($b$), this deflection $\delta$ is a function of the wavelength because the refractive index of the prism, e.g., the dispersion of the beam. Additionally, as shown in FIG. 6($c$), the beam is expanded in the direction that the prism deflects the beam. The magnification M of a prism is $$M = \frac{\cos(\phi)\cos(v)}{\cos(\theta)\cos(\mu)}$$

M is optimized when $\mu$ is zero which means that the beam is normally incident on the back face and requires an anti-reflection coating. The loss is due to the Fresnel reflection from the front surface. The magnification M then $$M = \frac{\cos(\phi)}{\cos(\theta)}$$

and the Fresnel reflection loss is written as $$T = \frac{4nM}{(n+M)^2}$$

Figure 7B:
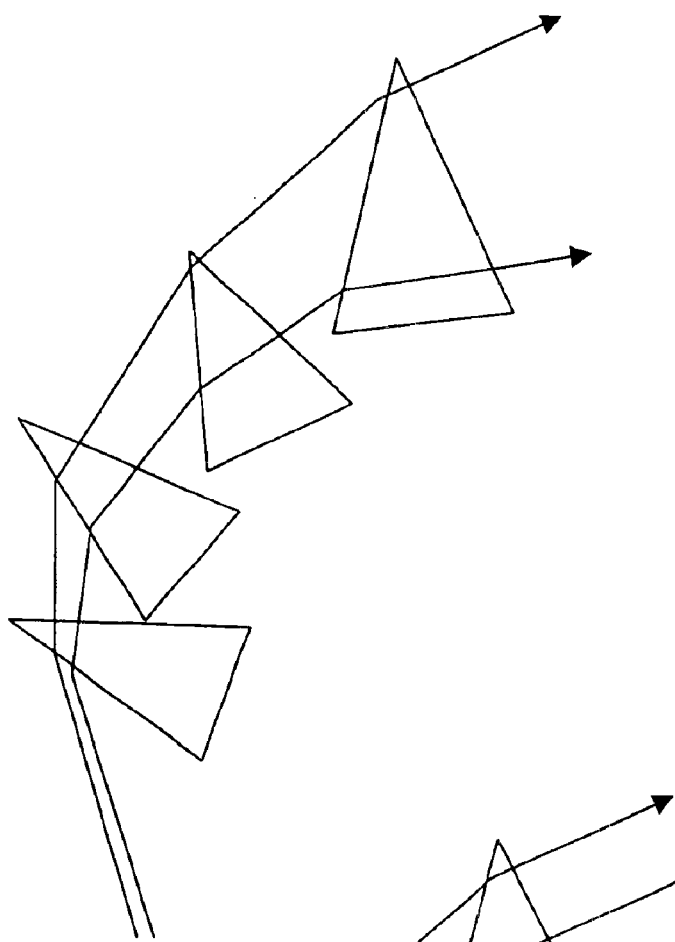
FIG. 7(b) is a schematic diagram of one embodiment of a beam expander that can be used with the dynamic channel equalizer of the present invention, illustrating the fresnel reflection of the multiple prism structure.
Figure 7A:
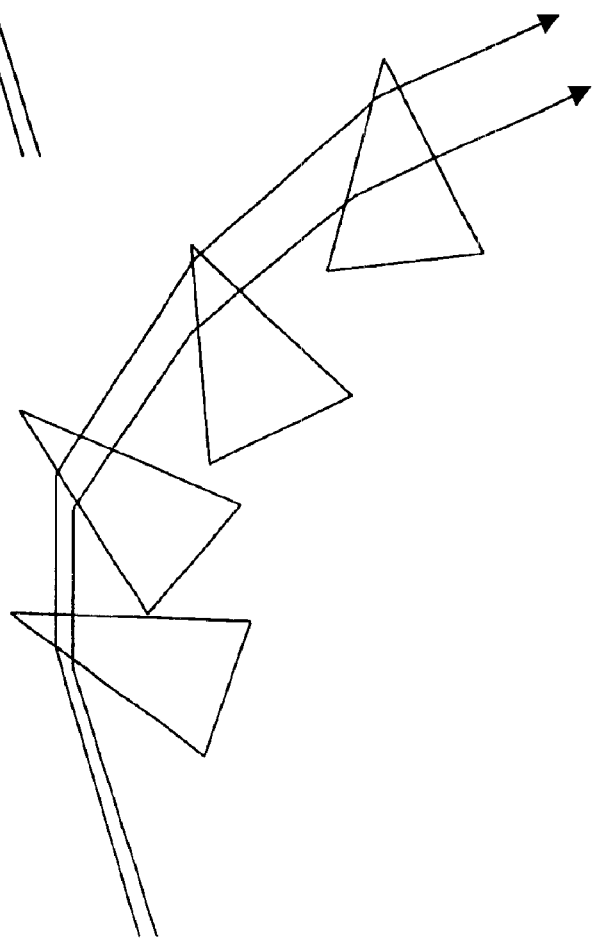
FIG. 7(a) is a schematic diagram of one embodiment of a beam expander that can be used with the dynamic channel equalizer of the present invention, illustrating the magnification of the multiple prism structure.

Large magnification can be obtained using a series of prisms as beam expander 42, illustrated in FIG. 7(a). With several prisms the magnification is $$M_{total} = \prod_{i=1}^{N} \frac{\cos(\phi_i)}{\cos(\theta_i)}$$

and the total transmission is $$T_{total} = \prod_{i=1}^{N} \frac{4nM_i}{(n+M_i)^2}$$

However, prisms are dispersive, see FIGS. 6(b) and 7(a), and the long and short wavelengths exit beam expander 42 at different angles.

Beam expander 42 is preferably achromatic with all wavelengths exiting parallel to each other. Mathematically this is expressed as:

$$\frac{\partial \delta}{\partial \lambda} = 0$$

Figure 8A:
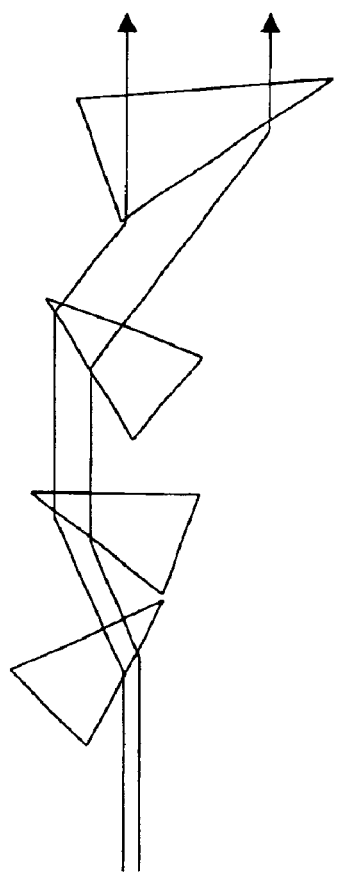
FIG. 8(a) is a schematic diagram of one embodiment of a beam expander that can be used with the dynamic channel equalizer of the present invention, illustrating the magnification of the multiple prism structure, with the prisms arranged in a down-up-up-down relationship.
Figure 8B:
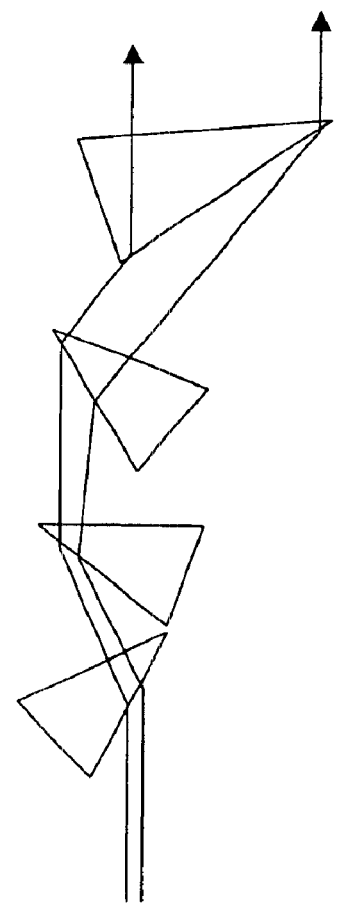
FIG. 8(b) is a schematic diagram of one embodiment of a beam expander that can be used with the dynamic channel equalizer of the present invention, illustrating the dispersion of the multiple prism structure, with the prisms arranged in a down-up-up-down relationship.

FIG. 7(b) shows the angular dispersion of a chain of prisms of beam expander 42. This angular dispersion can be compensated using the arrangement illustrated in FIGS. 8(a) and 8(b). In the FIG. 8(a) and 8(b) embodiments, the magnification is the same for a prism pointed up or down, and the deflection of the beam is a function of prism orientation. By orienting the prisms down-up-up-down, the dispersion is cancelled and the beam expansion of beam expander 42 is maintained. As an example using 4 fused silica prisms with 45 degree apex angles and AR coatings on the back surface, a magnification of 6.01 and a transmission of 98.3% are achieved.

Figure 9A:
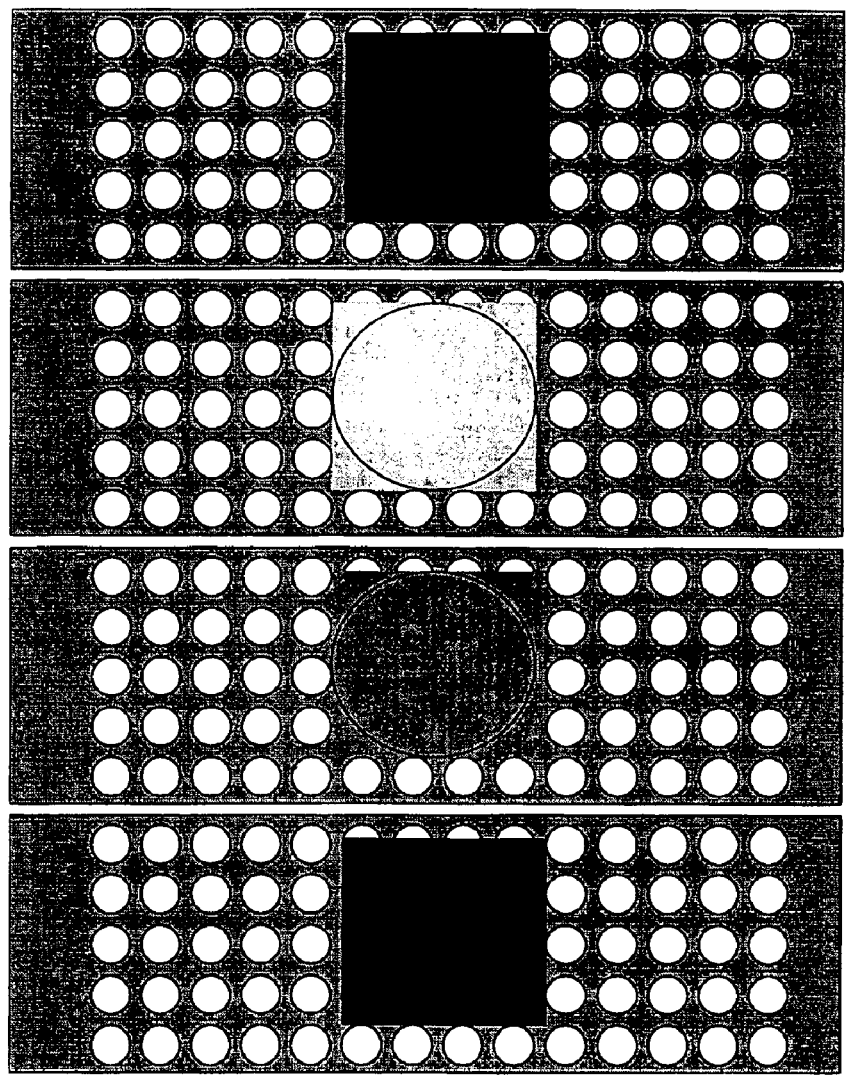
FIG. 9(a) illustrates an embodiment of a low PDL channel by channel attenuator.

Once the channels are spatially separated they must be individually attenuated in a manner that provides low polarization dependent loss (PDL). U.S. Pat. No. _____ discloses a membrane device with regularly spaced holes is described. This basic approach can be used with the FIG. 9 embodiment of controllable grating 18. In FIGS. 9(a) and 9(b), controllable grating 18 is a plurality of wide ribbons containing a pattern of holes.

With the FIGS. 9(a) and 9(b) embodiments, light beams from each channel are smaller than the ribbons of controllable grating 18. The ribbons of controllable grating 18 do not define a direction which can lead to a polarization that is dependent on direction. It is important to design the hole pattern such that the area occupies 50% of the total area. This allows for complete attenuation of the light when the ribbon is appropriately deflected.

The finer the hole pattern the smaller the effect on PDL. The limiting factor is semiconductor fabrication technology (as it relates to micro-lithography and material strength), which determines the minimum feature size.

To go from highly reflecting to full attenuation, the ribbons of controllable grating 18 must be moved by one quarter of a wavelength. The attenuation of a light beam reflected from a multi-ribbon grating light valve, e.g., controllable grating 18, has several subtleties related to the optimum height of the ribbons or membrane above the ground plane in the unactuated state. These subtleties are related to five aspects of the electrostatic actuation of the ribbons of controllable grating 18. First, the electrostatic force can only pull the ribbon toward the ground plane. Second, the force achievable decreases very rapidly with increasing ribbon distance from the ground plane. Third, if the ribbon is brought too close to the ground plane, and comes into physical contact with the surface, the ribbon can become stuck to the surface permanently. Fourth, the attenuation of the light beam is a nonlinear function of the height of the ribbon above the surface. Fifth, a certain attenuation state might be more desirable than other states if the device should suffer an accidental power loss. These five considerations can be important when determining the height of the unactuated ribbon above the surface of controllable grating 18.

In the embodiment of a thin ribbon above a grounded substrate, when a voltage is applied to the ribbon, the resulting electrostatic force between the ribbon and the substrate causes the ribbon to deflect towards the substrate. The thickness of the ribbon is negligible. The initial ribbon-substrate separation is denoted as "D". The furthest distance the ribbon can be deflected without being snapped down is D/3. The minimum deflection range of the ribbon during normal operation is lambda/4. Therefore, a necessary requirement in this embodiment is that D/3 is greater lambda/4.

If $\lambda$ is 1550 nm, D can be as small as 1550×3/4=1163 nm. Preferably, D is somewhat larger because, (i) a safety margin is needed, (ii) the wavelengths span a range and (iii) the ribbon is not actually of zero thickness. If the ribbon has a thickness $t_{ribbon}$ and relative dielectric constant $e_r$, the distance from the bottom of the ribbon to the substrate is D. The no-snap-down requirement is:

$$(D + t_{ribbon}/e_r)/3 > \lambda/4$$

For typical values ($t_{ribbon}$=600 nm, $e_r$=6 for silicon nitride), the minimum allowable value of D is 1063, i.e. $D + t_{ribbon}/e_r$ is 1763 nm. The top of the ribbon, the optically relevant surface, is 1763 nm above the substrate. This is the theoretical minimum elevation of the ribbon without a safety margin. Assuming a safety margin of approximately 150 nm is needed, the minimum elevation to 1913 nm.

However, it is preferably to increase the elevation to, for example, 1937.5 nm. This represents 1.25 times the nominal wavelength of 1550 nm. At this elevation, light reflected off the top of the ribbon is exactly a half-wavelength out of phase with light reflected off the exposed areas of the substrate, causing destructive interference. In this embodiment, the array of ribbons of controlling grating 18 can provide the maximum attenuation in an idle, unactuated state.

In another embodiment, the ribbon elevation is 2325 nm above the substrate, or 1.5 times the nominal wavelength of 1550 nm. At this elevation, light reflected off the top of the ribbon is exactly a quarter-wavelength out of phase with light reflected off the exposed areas of the substrate, causing constructive interference. This embodiment provides the minimum attenuation, or minimum insertion loss, in the idle state.

Ribbon elevations of 1.25 $\lambda$ and 1.5 $\lambda$ are useful because of the actuation voltages requirements. Higher elevations are possible but require higher actuation voltages and therefore less desirable.

Islands can be placed between the ribbons of controllable grating 18, as illustrated in FIGS. 9(a) and 9(b), The islands are preferably higher than the ribbons in order to protect the ribbons of controllable grating 18.

The islands can be prefabricated on the starting substrate before the ribbons are fabricated. One method of fabricating the substrate is to mask the locations of the islands and then perform a timed etch down into the substrate with a vertical, anisotropic plasma etch. Another method is to deposit or grow a different layer of material, e.g. silicon oxide, on top of the substrate, mask the island locations, then etch down into the new layer with a vertical, anisotropic plasma etch that preferentially stops when the underlying substrate is reached.

The foregoing description of the invention has been presented for purposes of illustration and description. It is not intended to be exhaustive or to limit the invention to the precise forms disclosed. Obviously, many modifications and variations will be apparent to practitioners skilled in this art.

What is claimed is:

1. A beam refraction apparatus, comprising:
   an input fiber that carries an input beam;
   a wavelength dispersive element coupled to the input fiber, the wavelength dispersive element spreading the input beam in at least one dimension as a function of wavelength and generating a dispersed beam;
   a controllable grating reflecting the dispersed beam to the wavelength dispersive element and generating a recombined beam, the controllable grating providing a controllable reflectivity as a function of wavelength;
   an output fiber that receives the recombined beam; and
   a collimating optical member coupled to the input and output fibers that passes the input beam and the recombined beams in parallel and opposite directions.

2. The apparatus of claim 1, wherein the collimating optical member is a dual fiber collimator.

3. The apparatus of claim 1, wherein the collimating optical member includes a prism.

4. The apparatus of claim 1, wherein the collimating optical member includes a pair of mirrors.

5. The apparatus of claim 1, wherein the collimating optical member includes at least one cylindrical lens.

6. The apparatus of claim 1, further comprising:
   a walk-off crystal positioned adjacent to the collimating optical member.

7. The apparatus of claim 6, further comprising:
   a half-wave plate positioned adjacent to the walk-off crystal.

8. The apparatus of claim 1, further comprising:
   a reflector positioned along an optical path of the collimating optical member, the reflector directing at least a portion of the input beam to the controllable grating.

9. The apparatus of claim 1, wherein the reflector is a turning mirror.

10. The apparatus of claim 1, wherein the wavelength dispersive element includes at least one microelectromechanical device.

11. The apparatus of claim 10, wherein the microelectromechanical device includes one or more micro mirrors.

12. The apparatus of claim 10, wherein the microelectromechanical device includes one or more cantilevers.

13. The apparatus of claim 10, wherein the microelectromechanical device includes one or more light controlling devices.

14. The apparatus of claim 10, wherein the microelectromechanical device includes one or more one or more deformable grating modulators.

15. The apparatus of claim 1, wherein the controllable grating is an array with a diffraction efficiency that is controlled as a function of position on the array.

16. The apparatus of claim 1, wherein the controllable grating is an array of ribbons.

17. The apparatus of claim 1, wherein the controllable grating is a micromachined grating device.

18. The apparatus of claim 1, further comprising:
   a lens positioned between the wavelength dispersive element and the controllable grating.

* * * * *